US012773918B2

(12) United States Patent
Hegde et al.

(10) Patent No.: US 12,773,918 B2
(45) Date of Patent: Oct. 27, 2026

(54) REAL TIME ESTIMATION OF ELECTRODE VOLTAGES AND ADAPTATION OF DIRECT CURRENT FAST CHARGING CONTROL

(71) Applicant: GM Global Technology Operations LLC, Detroit, MI (US)

(72) Inventors: Bharatkumar Hegde, Bloomfield Hills, MI (US); Ibrahim Haskara, Macomb, MI (US); Philip James Prociw, Clinton Township, MI (US); Chen-fang Chang, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 721 days.

(21) Appl. No.: 18/355,085

(22) Filed: Jul. 19, 2023

(65) Prior Publication Data

US 2025/0026222 A1 Jan. 23, 2025

(51) Int. Cl.

*B60L 53/62* (2019.01)
*G01R 19/25* (2006.01)
*H01M 10/44* (2006.01)
*H01M 10/48* (2006.01)

(52) U.S. Cl.

CPC .......... *B60L 53/62* (2019.02); *G01R 19/2503* (2013.01); *H01M 10/44* (2013.01); *H01M 10/48* (2013.01); *B60L 2240/547* (2013.01); *H01M 2220/20* (2013.01)

(58) Field of Classification Search

CPC .......... B60L 53/62; B60L 58/16; B60L 53/00; G01R 19/2503; H01M 2220/20

See application file for complete search history.

(56) References Cited

U.S. PATENT DOCUMENTS

| | | | | |
|---|---|---|---|---|
| 9,236,748 | B2 * | 1/2016 | Barsukov | H02J 7/00 |
| 11,101,679 | B2 * | 8/2021 | Battle | G06F 1/263 |
| 11,201,489 | B2 * | 12/2021 | Subbotin | G05B 13/0265 |
| 11,811,248 | B2 * | 11/2023 | Delevski | H02J 7/04 |
| 11,929,468 | B2 * | 3/2024 | Lim | B60L 53/62 |
| 2009/0228225 | A1 * | 9/2009 | Burgess | G01R 31/367 702/63 |
| 2018/0306868 | A1 * | 10/2018 | Kim | G01R 31/367 |
| 2020/0132777 | A1 | 4/2020 | K et al. | |
| 2020/0223318 | A1 * | 7/2020 | Campbell | B60L 58/15 |
| 2021/0057919 | A1 | 2/2021 | Subbotin et al. | |

FOREIGN PATENT DOCUMENTS

| | | |
|---|---|---|
| DE | 102019114734 A1 | 4/2020 |
| DE | 102020210132 A1 | 2/2021 |

OTHER PUBLICATIONS

German Application No. 10 2023 127 511.9 filed Oct. 9, 2023; German Office Action dated May 13, 2024; 4 pages.

* cited by examiner

*Primary Examiner* — Christle I Marshall

(74) *Attorney, Agent, or Firm* — CANTOR COLBURN LLP

(57) ABSTRACT

An electric vehicle includes a system for charging a battery of the electric vehicle. The system includes a sensor for obtaining a reference measurement of the battery during charging and a processor. The processor is configured to calculate an augmented state from the reference measurement, determine an anode voltage from the augmented state, compare the anode voltage to a threshold, and adjust a charging rate based on the comparison of the anode voltage to the threshold.

20 Claims, 7 Drawing Sheets

REAL TIME ESTIMATION OF ELECTRODE VOLTAGES AND ADAPTATION OF DIRECT CURRENT FAST CHARGING CONTROL

INTRODUCTION

The subject disclosure relates to charging an electric vehicle and, in particular, to a system and method for estimating electrode voltages during a charging operation and adjusting a parameter of the charging operation based on the estimated electrode voltages.

Batteries used in electric vehicles require charging periodically. During charging, it can be necessary to adjust a charging rate to prevent harm to the batteries, such as by preventing the occurrence of lithium platting at the batteries. Adjustments can be made based on an anode voltage or a cathode voltage. However, these voltages are measured between an anode and a reference electrode of the battery or between a cathode and the reference electrode. There is no direct method for accessing a reference electrode in order to estimate anode voltage and/or cathode voltage. Accordingly, it is desirable to provide a system and method for determining anode voltage and/or cathode voltage during a charging operation.

SUMMARY

In one exemplary embodiment, a method of charging a battery is disclosed. A reference measurement of the battery is obtained during charging. An augmented state is calculated from the reference measurement. An anode voltage is determined from the augmented state. The anode voltage is compared to a threshold. A charging rate is adjusted based on the comparison of the anode voltage to the threshold.

In addition to one or more of the features described herein, the method further includes determining the anode voltage from the augmented state using at least one of a regression model and a neural network. The method further includes adjusting a coefficient of the regression model or a parameter of the neural network to obtain an estimate of the anode voltage and a cathode voltage. The method further includes calculating the augmented state by applying a non-linear transformation to the reference measurement. The method further includes adjusting a coefficient of the non-linear transformation based on historical data. In an embodiment, the reference measurement is adjusted for an age of the battery. The method further includes assigning a severity metric when the anode voltage is less than the threshold, determining a degradation to the battery from the severity metric, and adjusting the charging rate based on the degradation of the battery.

In another exemplary embodiment, a system for charging a battery of an electric vehicle is disclosed. The system includes a sensor for obtaining a reference measurement of the battery during charging and a processor. The processor is configured to calculate an augmented state from the reference measurement, determine an anode voltage from the augmented state, compare the anode voltage to a threshold, and adjust a charging rate based on the comparison of the anode voltage to the threshold.

In addition to one or more of the features described herein, the processor is further configured to determine the anode voltage from the augmented state using at least one of a regression model and a neural network. The processor is further configured to adjusting a coefficient of the regression model or a parameter of the neural network to obtain an estimate of the anode voltage and a cathode voltage. The processor is further configured to apply a non-linear transformation to the reference measurement to calculate the augmented state. The processor is further configured to adjust a coefficient of the non-linear transformation based on historical data. The processor is further configured to adjust the reference measurement for an age of the battery. The processor is further configured to assign a severity metric when the anode voltage is less than the threshold, determine a degradation to the battery from the severity metric, and adjust the charging rate based on the degradation of the battery.

In yet another exemplary embodiment, an electric vehicle is disclosed. The electric vehicle includes a sensor for obtaining a reference measurement of a battery of the electric vehicle during charging and a processor. The processor is configured to calculate an augmented state from the reference measurement, determine an anode voltage from the augmented state, compare the anode voltage to a threshold, and adjust a charging rate based on the comparison of the anode voltage to the threshold.

In addition to one or more of the features described herein, the processor is further configured to determine the anode voltage from the augmented state using at least one of a regression model and a neural network. The processor is further configured to apply a non-linear transformation to the reference measurement to calculate the augmented state. The processor is further configured to adjust a coefficient of the non-linear transformation based on historical data. The processor is further configured to adjust the reference measurement for an age of the battery. The processor is further configured to assign a severity metric when the anode voltage is less than the threshold, determine a degradation to the battery from the severity metric, and adjust the charging rate based on the degradation of the battery.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
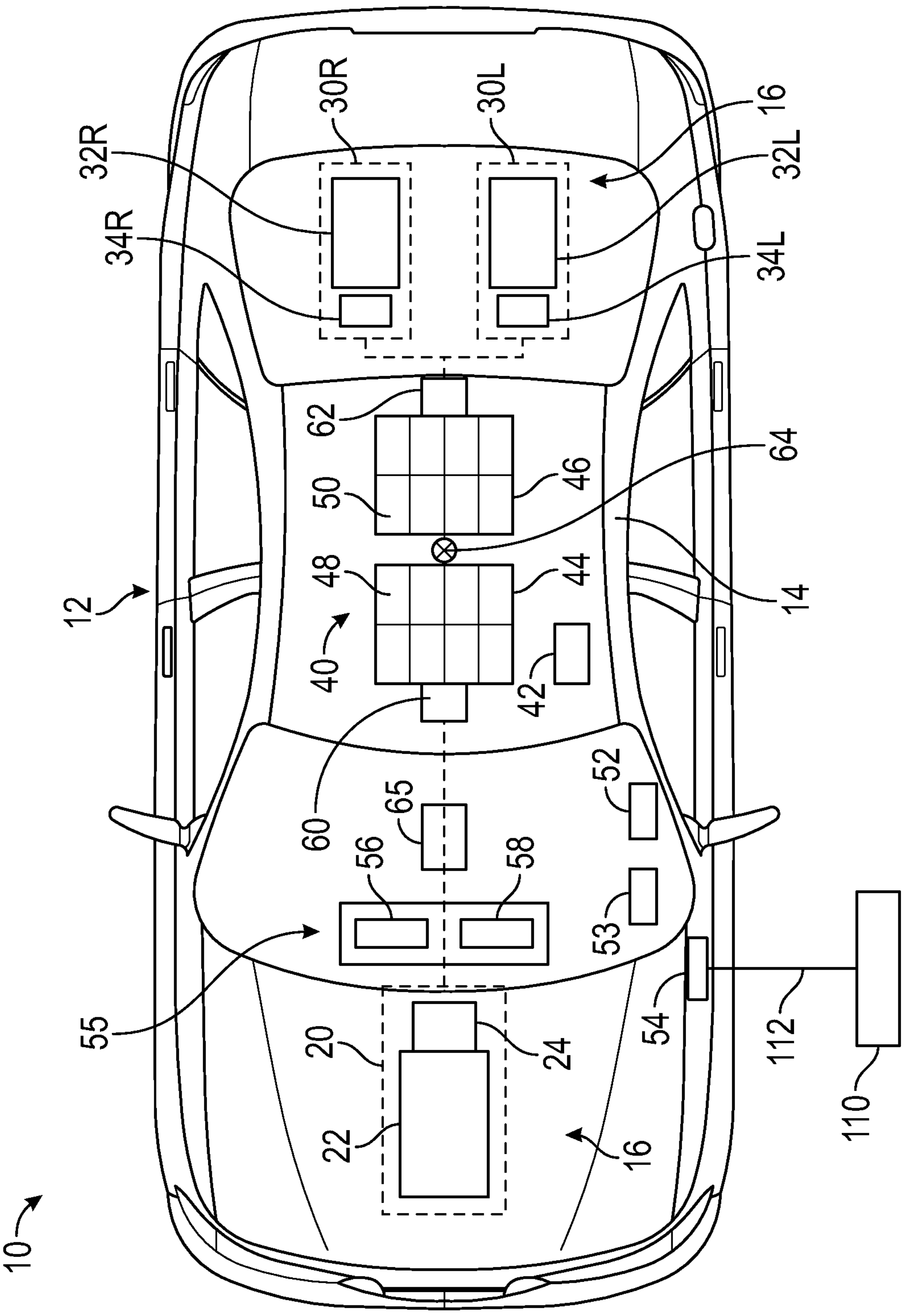
FIG. 1 shows an embodiment of a vehicle in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows an embodiment of a vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, and others.

The vehicle 10 may be an electrically powered vehicle (EV), a hybrid vehicle or any other vehicle. In an embodiment, the vehicle 10 is an electric vehicle that includes multiple motors and/or drive systems. Any number of drive units may be included, such as one or more drive units for applying torque to front wheels (not shown) and/or to rear wheels (not shown). The drive units are controllable to operate the vehicle 10 in various operating modes, such as a normal mode, a high-performance mode (in which additional torque is applied), all-wheel drive ("AWD"), front-wheel drive ("FWD"), rear-wheel drive ("RWD") and others.

For example, the propulsion system 16 is a multi-drive system that includes a front drive unit 20 for driving front wheels, and rear drive units for driving rear wheels. The front drive unit 20 includes a front electric motor 22 and a front inverter 24 (e.g., front power inverter module or FPIM), as well as other components such as a cooling system. A left rear drive unit 30L includes a left rear electric motor 32L and a left rear inverter 34L. A right rear drive unit 30R includes a right rear electric motor 32R and a right rear inverter 34R. The front inverter 24, left rear inverter 34L and right rear inverter 34R (e.g., power inverter units or PIMs) each convert direct current (DC) power from a high voltage (HV) battery system 40 to poly-phase (e.g., two-phase, three-phase, six-phase, etc.) alternating current (AC) power to drive the front electric motor 22 the left rear electric motor 32L and the right rear electric motor 32R.

As shown in FIG. 1, the drive systems feature separate electric motors. However, embodiments are not so limited. For example, instead of separate motors, multiple drives can be provided by a single machine that has multiple sets of windings that are physically independent.

As also shown in FIG. 1, the drive systems are configured such that the front electric motor 22 drives the front wheels (not shown), and the left rear electric motor 32L and right rear electric motor 32R drive the rear wheels (not shown). However, embodiments are not so limited, as there may be any number of drive systems and/or motors at various locations (e.g., a motor driving each wheel, twin motors per axle, etc.). In addition, embodiments are not limited to a dual drive system, as embodiments can be used with a vehicle having any number of motors and/or power inverters.

In the propulsion system 16, the front drive unit 20, left rear drive unit 30L and right rear drive unit 30R are electrically connected to the battery system 40. The battery system 40 may also be electrically connected to other electrical components (also referred to as "electrical loads"), such as vehicle electronics (e.g., via an auxiliary power module or APM 42), heaters, cooling systems and others. The battery system 40 may be configured as a rechargeable energy storage system (RESS).

In an embodiment, the battery system 40 includes a plurality of separate battery assemblies, in which each battery assembly can be independently charged and can be used to independently supply power to a drive system or systems. For example, the battery system 40 includes a first battery assembly such as a first battery pack 44 connected to the front inverter 24, and a second battery pack 46. The first battery pack 44 includes a plurality of battery modules 48, and the second battery pack 46 includes a plurality of battery modules 50. Each battery module 48, 50 includes a number of individual cells (not shown). In various embodiments, one or more of the battery packs can include a MODACS (Multiple Output Dynamically Adjustable Capacity) battery, as described herein with respect to FIGS. 2-4.

Each of the front electric motor 22 and the left rear electric motor 32L and right rear electric motor 32R is a three-phase motor having three phase motor windings. However, embodiments described herein are not so limited. For example, the motors may be any poly-phase machines supplied by poly-phase inverters, and the drive units can be realized using a single machine having independent sets of windings.

The battery system 40 and/or the propulsion system 16 includes a switching system having various switching devices for controlling operation of the first battery pack 44 and second battery pack 46, and selectively connecting the first battery pack 44 and second battery pack 46 to the front drive unit 20, left rear drive unit 30L and right rear drive unit 30R. The switching devices may also be operated to selectively connect the first battery pack 44 and the second battery pack 46 to a charging system. The charging system can be used to charge the first battery pack 44 and the second battery pack 46, and/or to supply power from the first battery pack 44 and/or the second battery pack 46 to charge another energy storage system (e.g., vehicle-to-vehicle (V2V) and/or vehicle-to-everything (V2X) charging). The charging system includes one or more charging modules. For example, a first onboard charging module (OBCM) 52 is electrically connected to a charge port 54 for charging to and from an AC system or device, such as a utility AC power supply. A second OBCM 53 may be included for DC charging (e.g., DC fast charging or DCFC). As shown in FIG. 1, the utility AC power supply is a charging station 110 that is connected to the charge port 54 via a cord 112.

In an embodiment, the switching system includes a first switching device 60 that selectively connects the first battery pack 44 to the front inverter 24, left rear inverter 34L and right rear inverter 34R, and a second switching device 62 that selectively connects the second battery pack 46 to the front inverter 24, left rear inverter 34L and right rear inverter 34R. The switching system also includes a third switching device 64 (also referred to as a "battery switching device") for selectively connecting the first battery pack 44 to the second battery pack 46 in series.

Any of various controllers can be used to control functions of the battery system 40, the switching system and the drive units. A controller includes any suitable processing device or unit and may use an existing controller such as a drive system controller, an RESS controller, and/or controllers in the drive system. For example, a controller 65 may be included for controlling switching and drive control operations as discussed herein.

The controller 65 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 65 may include a non-transitory computer-readable medium that stores instructions which, when processed by one or more processors of the controller 65, implement a method of determining anode voltage and cathode voltage during charging and adjusting a charging rate of the vehicle based on the anode voltage and the cathode voltage, according to one or more embodiments detailed herein.

The vehicle 10 also includes a computer system 55 that includes one or more processing devices 56 and a user interface 58. The computer system 55 may communicate with the charging system controller, for example, to provide commands thereto in response to a user input. The various processing devices, modules and units may communicate with one another via a communication device or system, such as a controller area network (CAN) or transmission control protocol (TCP) bus.

As illustrated herein, the vehicle 10 is an electric vehicle. In an alternative embodiment, the vehicle 10 can be an internal combustion engine vehicle, a hybrid vehicle, etc. or a system that utilizes a rechargeable battery pack such as a mobile phone, laptop computer etc.

Figure 2:
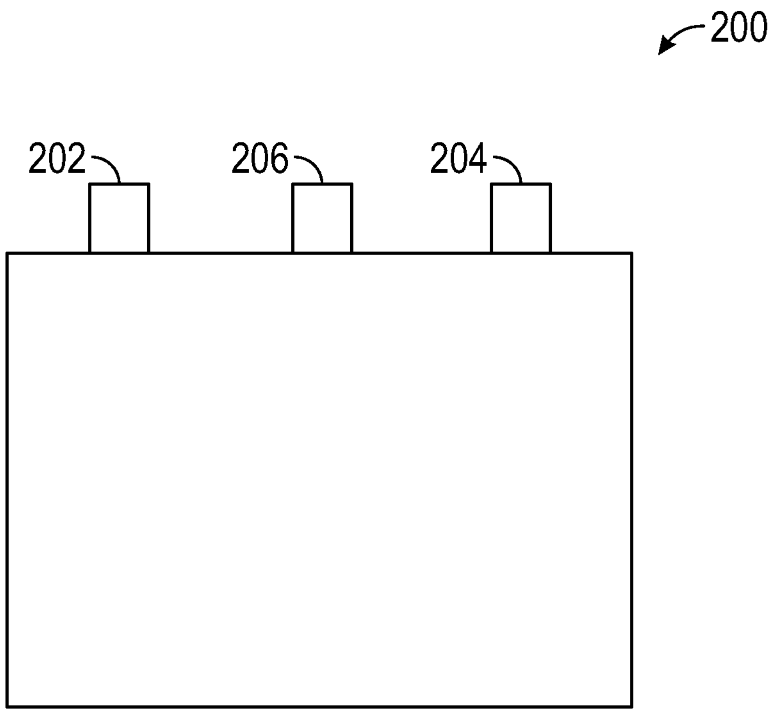
FIG. 2 shows a battery pack suitable for use at the electric vehicle, in an illustrative embodiment.

FIG. 2 shows a battery pack 200 suitable for use at the vehicle 10, in an illustrative embodiment. The battery pack 200 includes an anode 202, a cathode 204 and a reference electrode 206. A 3-electrode test can be used to obtain voltage measurements of the battery. The voltage measurement can include an anode voltage $V_A$ and cathode voltage $V_C$. The anode voltage is obtained by measuring a voltage difference between the anode 202 and the reference electrode 206, and the cathode voltage $V_C$ is obtained by measuring a voltage difference between the cathode 204 and the reference electrode 206.

Figure 3:
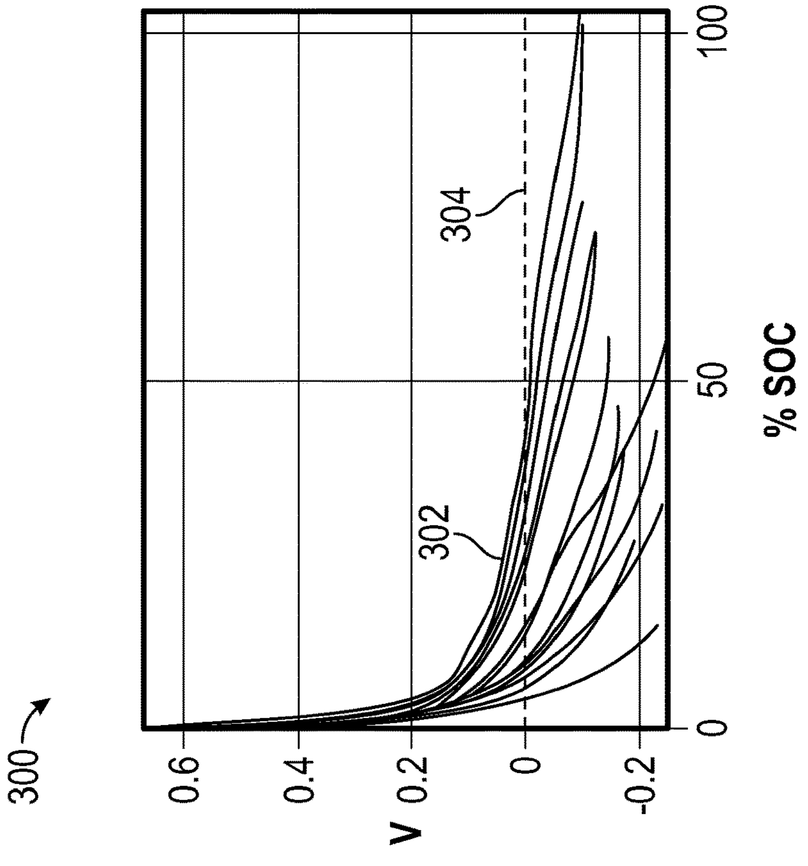
FIG. 3 shows a graph of a relation between anode voltage and state of charge of the battery.

FIG. 3 shows a graph 300 of a relation between anode voltage and state of charge of the battery. State of charge is shown as a percentage (SOC %) along the abscissa and anode voltage is shown in volts (V) along the ordinate axis. The graph 300 includes multiple curves 302 which are obtained at different temperatures of the battery and different charging currents at the battery. A voltage threshold 304 is shown that indicates a voltage below which lithium-plating occurs at the battery electrode. For illustrative purposes, the voltage threshold 304 is at zero volts. However, any suitable voltage threshold can be used.

Figure 4:
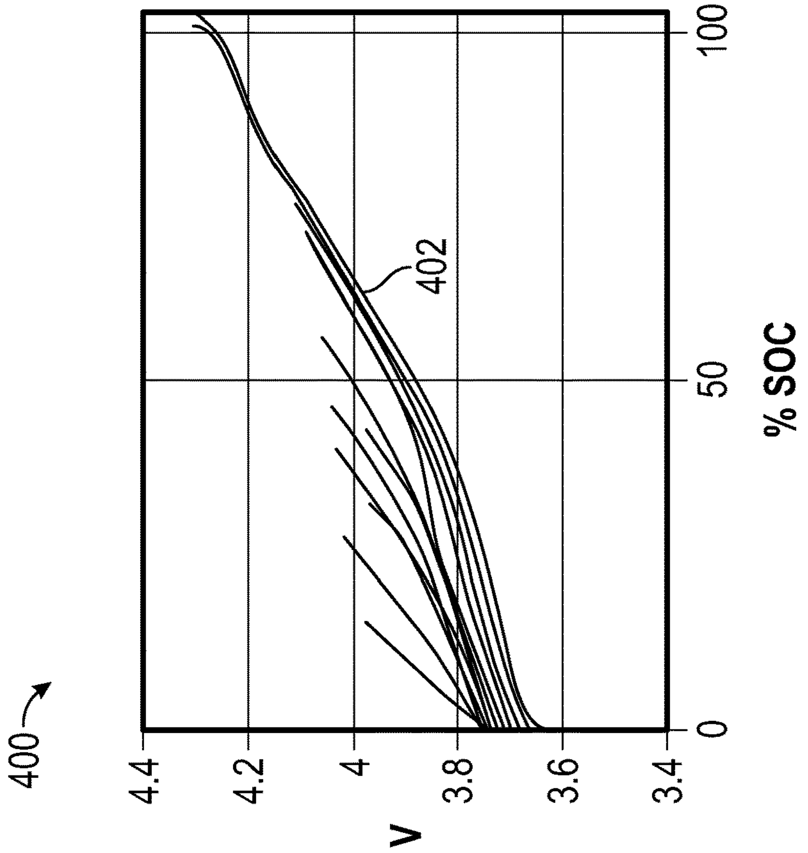
FIG. 4 shows a graph of a relation between cathode voltage and state of charge (SOC) of the battery.

FIG. 4 shows a graph 400 of a relation between cathode voltage and state of charge (SOC) of the battery. State of charge is shown as a percentage (SOC %) along the abscissa and cathode voltage is shown in volts (V) along the ordinate axis. The graph 400 includes multiple curves 402 which are obtained at different temperatures of the battery and different charging currents at the battery.

The methods disclosed herein allow determining anode voltage and cathode voltage when there is not access to the reference electrode. A set of laboratory-tested reference measurements are made of the anode voltage and cathode voltage using the reference electrode. These reference measurements include parameters such as that state of charge (SOC), Cell Voltage, anode voltage, cathode voltage, temperature, charging current, etc. and are used to create augmented states. An augmented state is a derived parameter engineered from the reference measurements. An augmented state can be derived using a non-linear transformation and/or a linear transformation of reference measurements. The augmented states are used to build a regression model or to train a neural network. During charging, the reference measurements are obtained and the augmented states Z are generated. The augments states Z are input to the regression model or the trained neural network to output anode voltage and cathode voltage. In this way, the regression model or the trained neural network acts as a virtual sensor for the anode voltage and cathode voltage. The anode voltage and cathode voltage can then be used to adjust or regulate the charging current applied at the battery.

Figure 5:
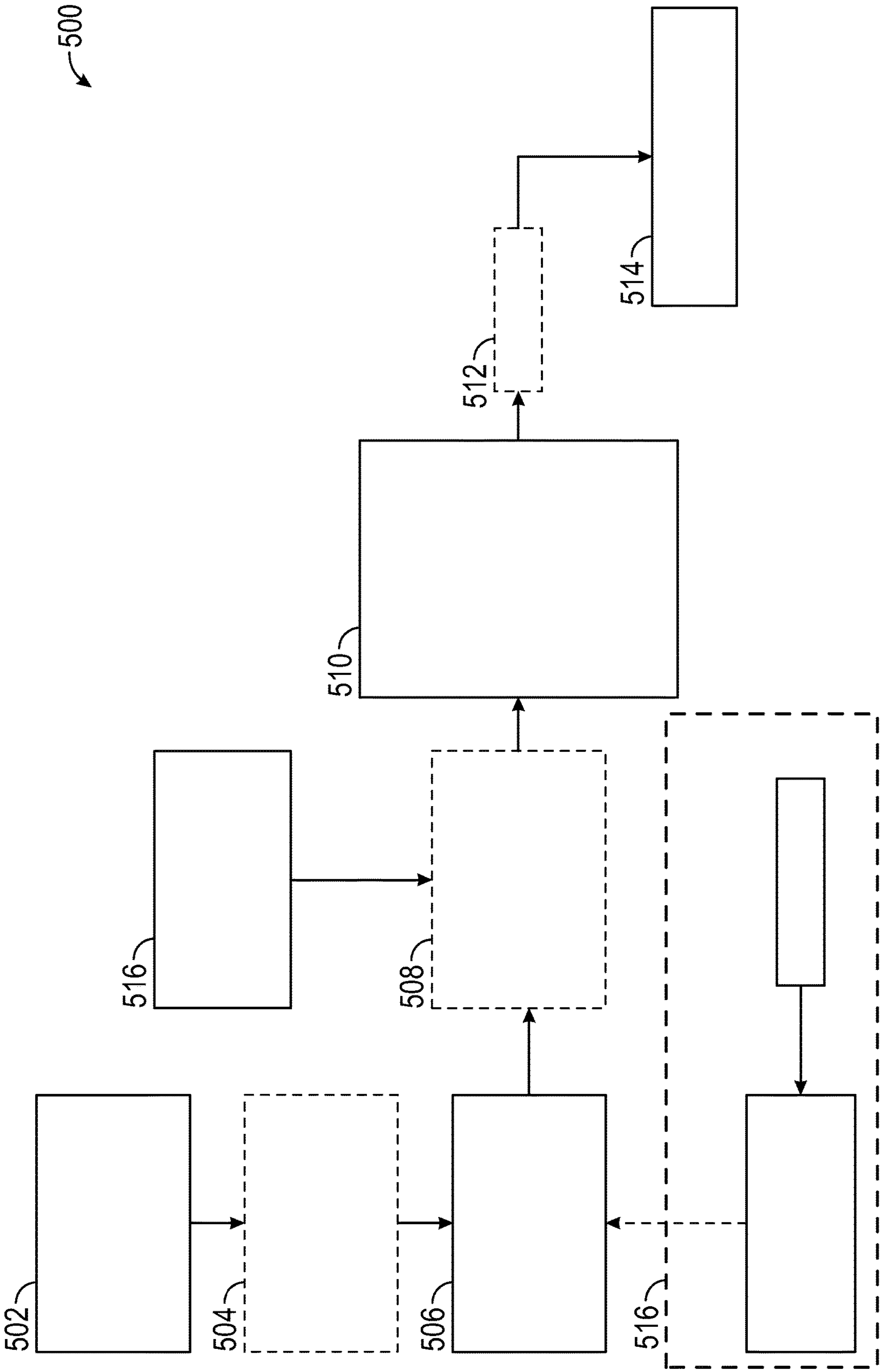
FIG. 5 is a flowchart illustrating a method for developing a virtual sensor based on augmented states.

FIG. 5 is a flowchart 500 illustrating a method for developing a virtual sensor based on augmented states. The method includes developing a regression model or training a neural network based on experimental data. In box 502, experimental tests are performed using three-electrode measurements on one or more batteries in a controlled or laboratory environment. Three-electrode measurements include an anode voltage $V_A$ (measured between anode 202 and reference electrode 206) and a cathode voltage $V_C$ (measured between cathode 204 and reference electrode 206). The experimental data can be obtained with the one or more batteries at a plurality of temperatures and a plurality of charging currents. In box 504, the three-electrode measurements are cleaned and preprocessed to output reference measurements. In box 506, the preprocessed reference measurements are obtained. Exemplary reference measurements are labelled X and are shown in Eq. (1):

$$X = [SOC, T, C_{rate}, V_{cell}] \quad \text{Eq. (1)}$$

where SOC is the state of charge of the battery, T is the temperature of the battery, $C_{rate}$ is the charging rate and $V_{cell}$ is the voltage of the cell.

In box 508, a non-linear transformation $F_a(X)$ is performed on the reference measurements X, as shown in Eq. (2):

$$F_a(X) \rightarrow Z \quad \text{Eq. (2)}$$

The nonlinear transformation generates augmented states Z in box 510. An illustrative set of augmented states is shown in Eq. (3):

$$Z = [SOC, T, V_{cell}, \eta, \Delta\Phi, OCP_n, OCP_p, V_{OC}, T_e, \ldots\ ] \quad \text{Eq. (3)}$$

In Eq. (3), SOC, T and $V_{cell}$ are original reference measurements and $\eta$, $\Delta\Phi$, $OCP_n$, $OCP_p$, $V_{OC}$, $T_e$ are the augmented states due to the non-linear transformations on X. The augmented states are discussed in Eqs. (4)-(9), where:

$$\eta = \frac{2TR}{F} \cdot \sinh^{-1}(f(C_{rate})) \quad \text{Eq. (4)}$$

where $\eta$ is a current flux, T is a temperature, R is the universal gas constant, F is Faraday's constant;

$$\Delta\Phi = K_1 \cdot C_{rate} + K_2 \cdot T \cdot \log_e(f(C_{rate})) \quad \text{Eq. (5)}$$

where $\Delta\Phi$ is a derived parameter, and $K_1$ and $K_2$ are coefficients;

$$OCP_n = c_{10} + c_{11}SOC + c_{12}SOC^2 + \quad \text{Eq. (6)}$$

where $OCP_n$ is the open circuit potential for the anode and $c_{10}$, $c_{11}$, $c_{12}$ are coefficients;

$$OCP_p = c_{20} + c_{21}SOC + c_{22}SOC^2 + \qquad \text{Eq. (7)}$$

where $OCP_p$ is the open circuit potential for the cathode and $c_{20}$, $c_{21}$, $c_{22}$ are coefficients;

$$V_{oc} = OCP_p - OCP_n \qquad \text{Eq. (8)}$$

where $V_{oc}$ is the open circuit voltage; and $$T_e = K_3 \cdot \exp\left(-\frac{E_{ac}}{RT}\right) \qquad \text{Eq. (9)}$$

where $T_e$ is a derived temperature parameter.

In box 512, a regression analysis is performed on the augmented states Z to generate a regression model capable of outputting an anode voltage $V_A$ and cathode voltage $V_C$ based on the augmented states Z. Alternatively, a neural network can be trained using augmented states Z to output an anode voltage $V_A$ and cathode voltage $V_C$.

In the case of training a neural network, a function $f(Z,\theta)$ is obtained that generates anode voltage and cathode voltage based on augmented states. The neural network can be trained by optimizing a cost function, shown in Eq. (10)

$$\underset{\theta}{\operatorname{argmin}}\{f(Z, \theta) - y^*\} \qquad \text{Eq, (10)}$$

where θ represents the parameters of the neural network and $$y^* = [V^*_{anode}, V^*_{cathode}] \qquad \text{Eq. (11)}$$

in which $V_{anode}^*$ is the anode voltage measured at the 3-electrode test and $V_{cathode}^*$ is the cathode voltage measured at the 3-electrode test.

In box 514, insights from historical operation of the methods can be applied to the transformation (e.g., coefficients of the non-linear transformations $F_a(X)$, thereby refining the resulting augmented states A. Also, in box 516, laboratory measurements obtained at test batteries having different ages can used to adjust the values of the reference measurements X based on the age of the battery.

Figure 6:
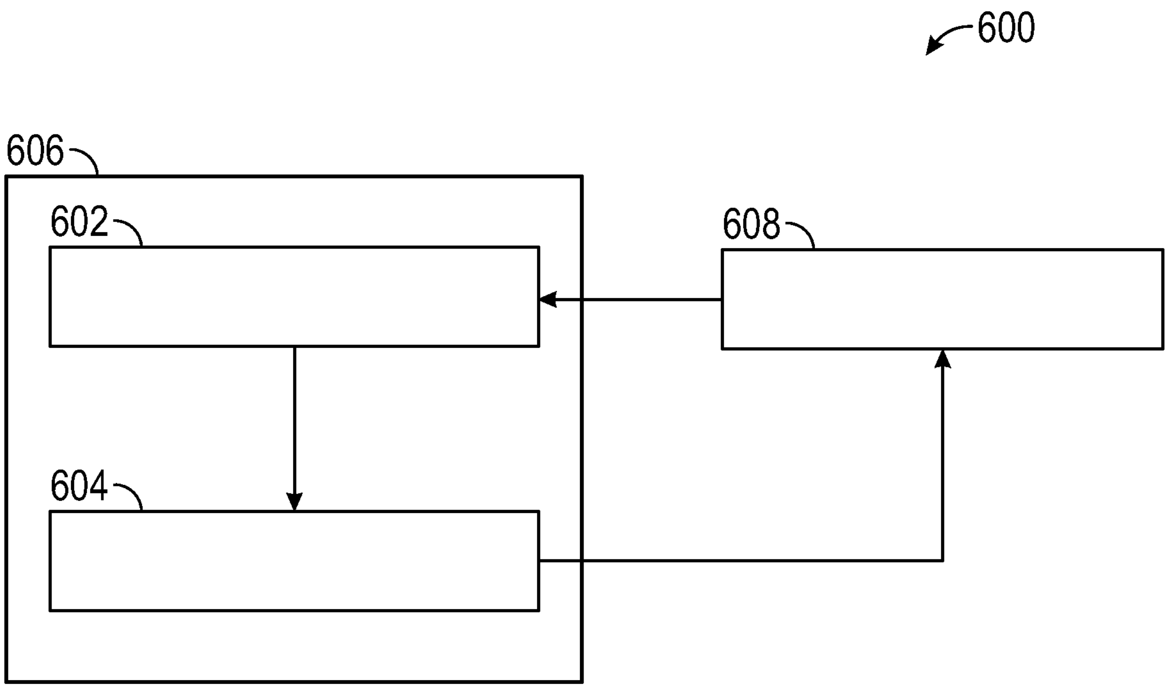
FIG. 6 shows a diagram of a charging system for adjusting a charging rate for the battery during a charging operation.

FIG. 6 shows a diagram 600 of a charging system for adjusting a charging rate for the battery during a charging operation. The charging system includes a battery management system 602 and an onboard charging module 604 running on a processor 606 of the vehicle. The battery management system 602 obtains reference measurements of electrical parameters of the battery 608 or from sensors at the battery and determines an anode voltage and cathode voltage from these measurements using the regression model or neural network discussed with respect to FIG. 5. The battery management system 602 determines a need for adjusting a charging rate based on the anode voltage and/or cathode voltage. The onboard charging module 604 determines what adjustments are to be made and make the adjustments to the charging rate accordingly.

Figure 7:
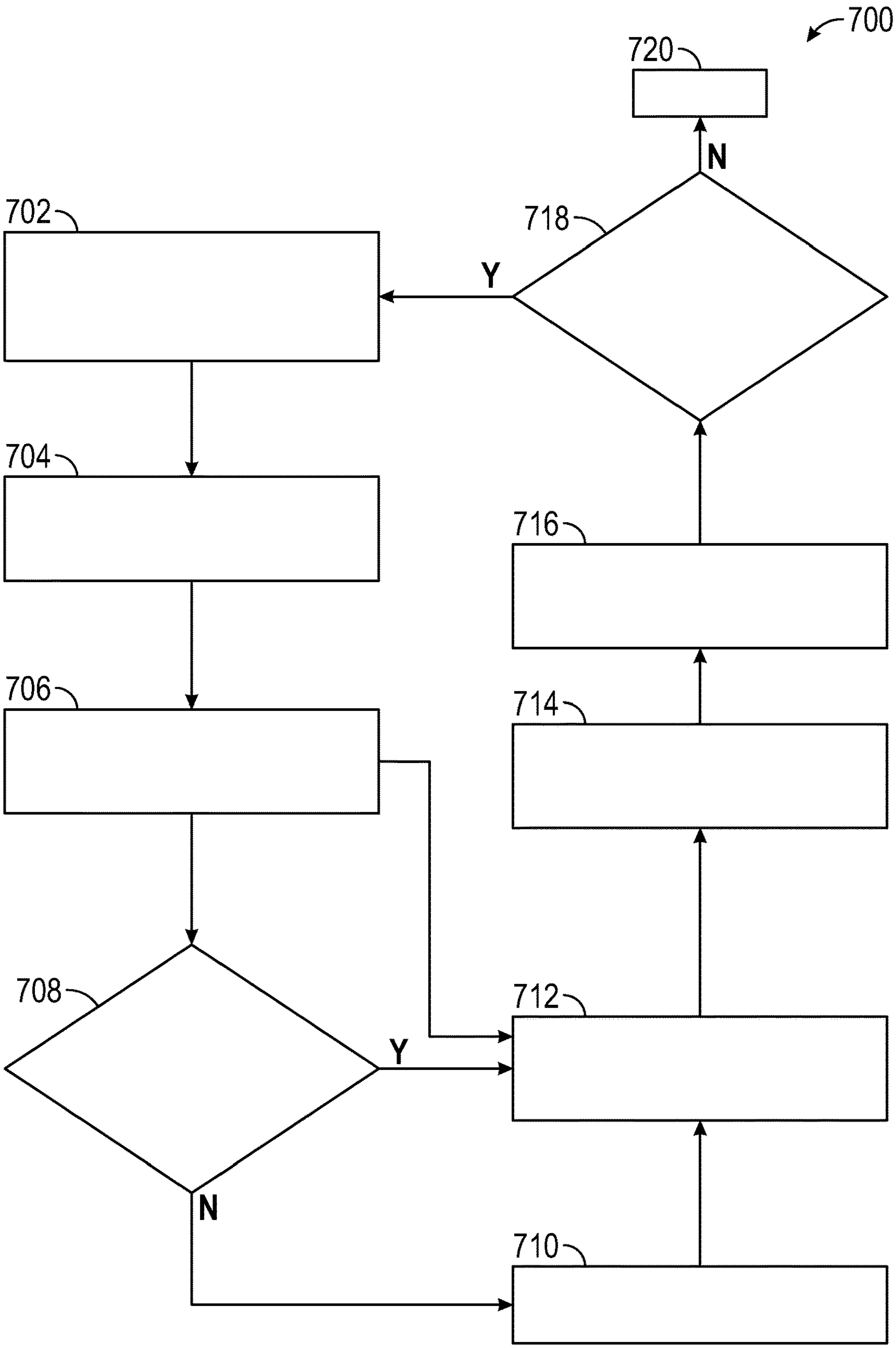
FIG. 7 shows a flowchart of a method of operation of the charging system for charging of the electric vehicle.

FIG. 7 shows a flowchart 700 of a method of operation of the charging system for charging of the electric vehicle. In box 702, electrical parameters X of the battery are measured the during a charging operation. In box 704, a transformation is applied to the reference measurements X to obtain augmented states Z. The transformation can be a linear transformation, a non-linear transformation or a combination thereof. In box 706, the regression model is applied to the augmented states Z to output an anode voltage $V_A$ and a cathode voltage $V_C$. Alternatively, augmented states Z are input to the trained neural network, which outputs an anode voltage $V_A$ and a cathode voltage $V_C$.

In box 708, the battery management system makes a decision based on the anode voltage $V_A$ and the cathode voltage $V_C$. Lithium plating can occur when the anode voltage is less than a given voltage threshold. Thus, when the anode voltage is more than the threshold voltage, then lithium platting is not occurring and the method proceeds to box 710. When the anode voltage is equal to or less than the threshold voltage, the lithium plating is occurring and the method proceeds to box 712.

In box 710, the charging strategy can be calibrated according to other considerations. For example, the original charging strategy can be maintained. From box 710, the method proceeds to box 712. In box 712, a charging strategy can be adapted to prevent or reduce the occurrence of lithium plating. Adapting the charging strategy includes determine a charging current request $I_{request}$ to be sent to the charging station.

In one embodiment, the charging current request is calculated using a heuristics-based control as shown in Eqs. (11) and (12):

$$I_{request} = I_{cal} + \Delta I \qquad \text{Eq. (11)}$$

where $$\Delta I = \begin{cases} -K * (V_{anode} - \epsilon)^2 & \text{if } V_{anode} < \epsilon \\ 0 & \text{otherwise} \end{cases} \qquad \text{Eq. (12)}$$

In another embodiment, the charging current request is calculated based on an optimized reference tracking control using Eq. (13):

$$I_{request} = \operatorname{argmin} \sum\nolimits_{k=1:N} \left[\left(V_{anode}(k) - V^{ref}_{anode}(k)\right)\right] \qquad \text{Eq. (13)}$$

In yet another embodiment, the charging current request is calculated based on a pre-determined control logic using Eq. (14):

$$I_{request} = I_{cal} + \Delta I \qquad \text{Eq. (14)}$$

where ΔI is obtained from a lookup table $$\Delta I = LookUpTable(V_{anode}, V_{cathode}, \ldots) \qquad \text{Eq. (15)}$$

In box 714, the charge current is sent to the on-board charging module. In box 716, the onboard charging module controls the charging current applied to the battery. In box 718, a decision is made based on the charge state or if the battery is still charging. If the battery is fully charged, the method proceeds to box 720 at which the charging operation is ended. Returning to box 718, if the battery is still charging, the method returns to box 702.

Figure 8:
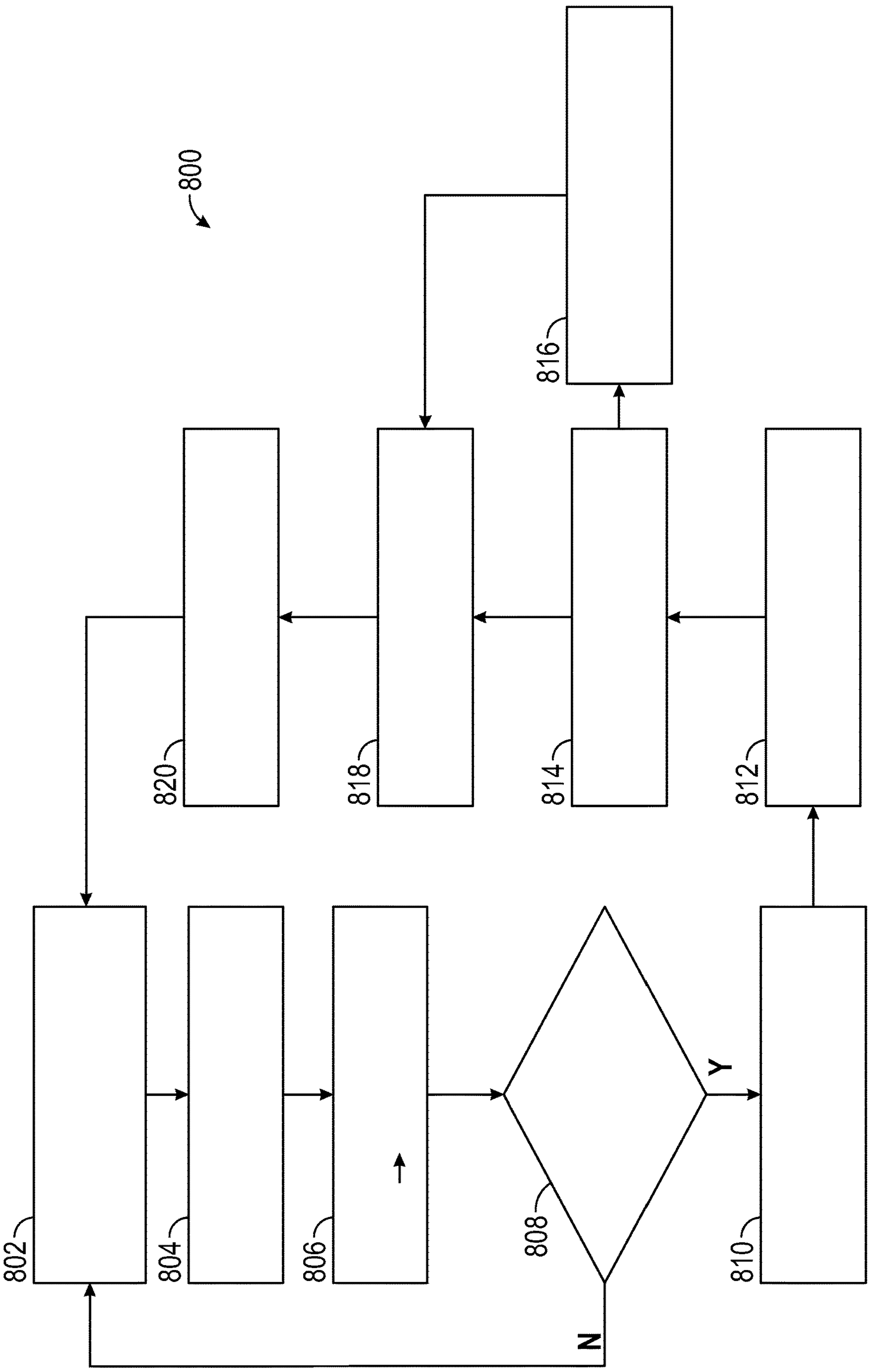
FIG. 8 shows a flowchart of a method for operating the charging system based on a severity of a violation of the Li-plating threshold.

FIG. 8 shows a flowchart 800 of a method for operating the charging system based on a severity of a violation of the Li-plating threshold. In box 802, reference measurements X of the battery are obtained during the charging operation. In box 804, a transformation is applied to the reference measurements X to obtain augmented states Z. The transformation can be a linear transformation, a non-linear transformation or a combination thereof. In box 806, the regression model is applied to the augmented states Z to output an anode voltage $V_A$ and a cathode voltage $V_C$. Alternatively, augmented states Z are input to the trained neural network, which outputs an anode voltage $V_A$ and a cathode voltage $V_C$, shown in In box 808, the battery management system makes a decision based on the anode voltage $V_A$ and the cathode voltage $V_C$. Thus, when the anode voltage is more than the threshold voltage, the returns to box 802. When the anode voltage is equal to or less than the threshold voltage, the method proceeds to box 810.

In box 810, a severity metric is assigned based on the amount by which the anode voltage exceeds the threshold voltage. For example, a first severity metric $S_1$ is assigned when the amount by which the anode voltage exceeds the threshold voltage is 0.1 Volt, a second severity metric $S_2$ is assigned when the amount is 0.5 Volt, a third severity metric $S_3$ is assigned when the amount is 1 Volt, etc. The severity metric can be a number between 1 and 10.

In box 812, the severity metric is stored in memory. A plurality of severity metrics obtained at a plurality of times can be stored. In box 814, a battery degradation metric is assigned based on the violation metric. The battery degradation metric can indicate a degree of degradation of the battery based on the amount of damage or plating at the battery recorded by the severity metric. In box 816, the battery degradation is sent to an operator or engineer via an uplink or cloud connection. From either box 814 or box 816, the method proceeds to box 818. In box 818, the parameters of the battery management system are updated based on the degradation of the battery. In box 820, the updated parameters are sent to the battery management system. From box 820, the method returns to box 802.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of charging a battery, comprising:
obtaining a reference measurement of the battery during charging;
calculating an augmented state from the reference measurement;
determining an anode voltage from the augmented state;
comparing the anode voltage to a threshold; and
adjusting a charging rate based on the comparison of the anode voltage to the threshold.

2. The method of claim 1, further comprising determining the anode voltage from the augmented state using at least one of: (i) a regression model; and (ii) a neural network.

3. The method of claim 2, further comprising adjusting a coefficient of the regression model or a parameter of the neural network to obtain an estimate of the anode voltage and a cathode voltage.

4. The method of claim 1, further comprising calculating the augmented state by applying a non-linear transformation to the reference measurement.

5. The method of claim 4, further comprising adjusting a coefficient of the non-linear transformation based on historical data.

6. The method of claim 1, wherein the reference measurement is adjusted for an age of the battery.

7. The method of claim 1, further comprising assigning a severity metric when the anode voltage is less than the threshold, determining a degradation to the battery from the severity metric, and adjusting the charging rate based on the degradation of the battery.

8. A system for charging a battery of an electric vehicle, comprising:
sensor for obtaining a reference measurement of the battery during charging;
a processor configured to:
calculate an augmented state from the reference measurement;
determine an anode voltage from the augmented state;
compare the anode voltage to a threshold; and
adjust a charging rate based on the comparison of the anode voltage to the threshold.

9. The system of claim 8, wherein the processor is further configured to determine the anode voltage from the augmented state using at least one of: (i) a regression model; and (ii) a neural network.

10. The system of claim 9, wherein the processor is further configured to adjusting a coefficient of the regression model or a parameter of the neural network to obtain an estimate of the anode voltage and a cathode voltage.

11. The system of claim 8, wherein the processor is further configured to apply a non-linear transformation to the reference measurement to calculate the augmented state.

12. The system of claim 11, wherein the processor is further configured to adjust a coefficient of the non-linear transformation based on historical data.

13. The system of claim 8, wherein the processor is further configured to adjust the reference measurement for an age of the battery.

14. The system of claim 8, wherein the processor is further configured to assign a severity metric when the anode voltage is less than the threshold, determine a degradation to the battery from the severity metric, and adjust the charging rate based on the degradation of the battery.

15. An electric vehicle, comprising:

sensor for obtaining a reference measurement of a battery of the electric vehicle during charging;

a processor configured to:

calculate an augmented state from the reference measurement;

determine an anode voltage from the augmented state;

compare the anode voltage to a threshold; and adjust a charging rate based on the comparison of the anode voltage to the threshold.

16. The electric vehicle of claim 15, wherein the processor is further configured to determine the anode voltage from the augmented state using at least one of: (i) a regression model; and (ii) a neural network.

17. The electric vehicle of claim 15, wherein the processor is further configured to apply a non-linear transformation to the reference measurement to calculate the augmented state.

18. The electric vehicle of claim 17, wherein the processor is further configured to adjust a coefficient of the non-linear transformation based on historical data.

19. The electric vehicle of claim 15, wherein the processor is further configured to adjust the reference measurement for an age of the battery.

20. The electric vehicle of claim 15, wherein the processor is further configured to assign a severity metric when the anode voltage is less than the threshold, determine a degradation to the battery from the severity metric, and adjust the charging rate based on the degradation of the battery.

* * * * *